(12) United States Patent
Park et al.

(10) Patent No.: US 11,262,649 B2
(45) Date of Patent: Mar. 1, 2022

(54) APPARATUS FOR STORING MASK

(71) Applicant: Samsung Electronics Co., Ltd., Suwon-si (KR)

(72) Inventors: Ginam Park, Incheon (KR); Sangmin Kim, Hwaseong-si (KR); Jongsam Kim, Suwon-si (KR); Hongjin Kim, Seoul (KR); Chuljun Park, Seoul (KR); Yongjun Ahn, Suwon-si (KR); Sangkyung Lee, Hwaseong-si (KR); Junyong Lee, Suwon-si (KR); Taijo Jeon, Suwon-si (KR); Kyubum Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 79 days.

(21) Appl. No.: 16/901,466

(22) Filed: Jun. 15, 2020

(65) Prior Publication Data

US 2021/0033965 A1 Feb. 4, 2021

(30) Foreign Application Priority Data

Jul. 30, 2019 (KR) .................. 10-2019-0092533

(51) Int. Cl.
| | |
|---|---|
| *G03F 1/66* | (2012.01) |
| *B01D 46/00* | (2006.01) |
| *B01D 46/44* | (2006.01) |
| *F25B 21/02* | (2006.01) |
| *F24F 3/14* | (2006.01) |

(Continued)

(52) U.S. Cl.
CPC ............ *G03F 1/66* (2013.01); *B01D 46/0002* (2013.01); *B01D 46/0023* (2013.01); *B01D 46/4263* (2013.01); *B01D 46/448* (2013.01); *B01D 50/00* (2013.01); *F24F 3/14* (2013.01); *F24H 3/04* (2013.01); *F25B 21/02* (2013.01); *H05B 1/023* (2013.01)

(58) Field of Classification Search
CPC ........... G03F 1/66; B01D 50/00; B01D 46/00; B01D 46/0002; B01D 46/0023; B01D 46/448

See application file for complete search history.

(56) References Cited

U.S. PATENT DOCUMENTS

| | | | |
|---|---|---|---|
| 4,999,671 A | * | 3/1991 | Iizuka ................. G03F 7/70741 355/23 |
| 6,521,007 B1 | | 2/2003 | Tanaka et al. |

(Continued)

*Primary Examiner* — Robert A Hopkins
(74) *Attorney, Agent, or Firm* — Harness, Dickey & Pierce, P.L.C.

(57) ABSTRACT

An apparatus for storing a mask includes a main body comprising a first region and a second region, the first region having a plurality of mask containers, a gas supply pipe having an outer portion outside of the main body, a fan in the first region to propel the gas from the second region to the first region, a filter disposed at a front end and/or a rear end of the fan, a heat exchanger in the second region and configured to exchange heat with the flowing gas, a Peltier element at the outer portion of the gas supply pipe, a first sensor installed in the gas supply pipe upstream of the Peltier element, a second sensor installed in the second region in a lower position to the heat exchanger, and a controller connected to the first and second sensors and the Peltier element.

20 Claims, 4 Drawing Sheets

(51) Int. Cl.
*H05B 1/02* (2006.01)
*F24H 3/04* (2022.01)
*B01D 46/42* (2006.01)
*B01D 50/00* (2022.01)

(56) References Cited

U.S. PATENT DOCUMENTS

| | | |
|---|---|---|
| 6,562,094 B2 | 5/2003 | Denker et al. |
| 6,848,876 B2 * | 2/2005 | Babbs ............... B65G 1/045 414/217.1 |
| 9,524,892 B2 | 12/2016 | Rebstock |
| 9,978,623 B2 | 5/2018 | Babbs et al. |
| 2012/0325349 A1 | 12/2012 | Moriya |
| 2017/0052460 A1 | 2/2017 | Yoneda et al. |
| 2018/0286726 A1 | 10/2018 | Rebstock |

* cited by examiner

APPARATUS FOR STORING MASK

CROSS-REFERENCE TO RELATED APPLICATION

This application claims benefit of priority to Korean Patent Application No. 10-2019-0092533 filed on Jul. 30, 2019, in the Korean Intellectual Property Office, the disclosure of which is incorporated herein by reference in its entirety.

BACKGROUND

1. Field

The present disclosure relates to an apparatus for storing exposure masks.

2. Description of Related Art

Generally, lithography exposure masks are stored in mask-storing apparatuses. Conventionally, external air flows through a fan to supply a filtered gas to a mask-storing apparatus. As the external air flows through a fan into the mask-storing apparatus, humidity and temperature regulation may not be feasible, and as the supplied gas is discharged externally, a large amount of gas needs to be continuously supplied.

SUMMARY

At least one embodiment relates to an apparatus for storing a mask, in which the cleanness, temperature, and humidity of the interior can be controlled.

At least one embodiment relates to an apparatus for storing a mask not requiring a large amount of external gas supply.

In one embodiment, the apparatus for storing a mask includes an main body comprising a first region and a second region around the first region, the first region having a plurality of mask containers configured to receive masks, a gas supply pipe having an outer portion, the, the outer portion of the gas supply pipe being outside of the main body of the apparatus, the gas supply pipe configured to supply gas to the main body, a fan in the first region, the fan configured to propel the gas from the second region to the first region, a filter disposed at at least one of a front end and a rear end of the fan in a gas flow path, a heat exchanger in the second region, the heat exchanger configured to exchange heat with the flowing gas, a Peltier element in the outer portion of the gas supply pipe, a first sensor up stream of the Peltier element in the gas supply pipe, a second sensor in the second region of the main body so as to be disposed in a lower portion of the heat exchanger, and a controller connected to the first sensor, the second sensor, and the Peltier element.

BRIEF DESCRIPTION OF DRAWINGS

The above and other aspects, features, and advantages will be more clearly understood from the following detailed description, taken in conjunction with the accompanying drawings, in which.

DETAILED DESCRIPTION

Hereinafter, example embodiments will be described with reference to the figures.

Figure 1:
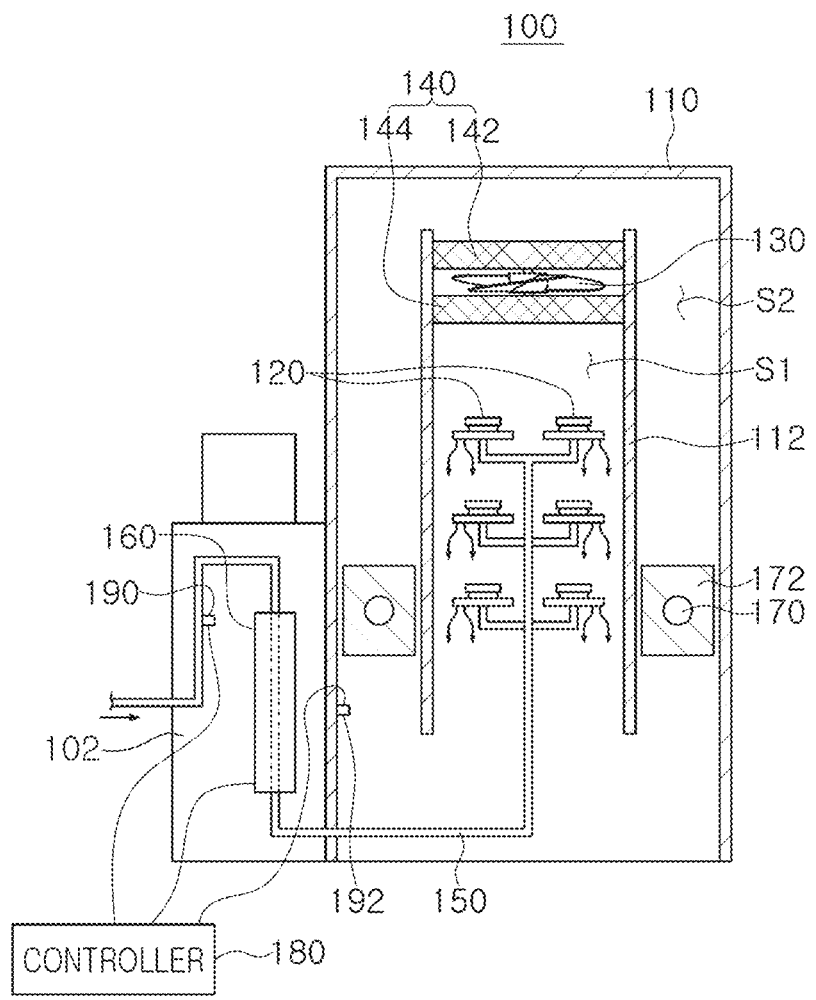
FIG. 1 is a diagrammatic view of an apparatus for storing a mask according to an example embodiment.
Figure 2:
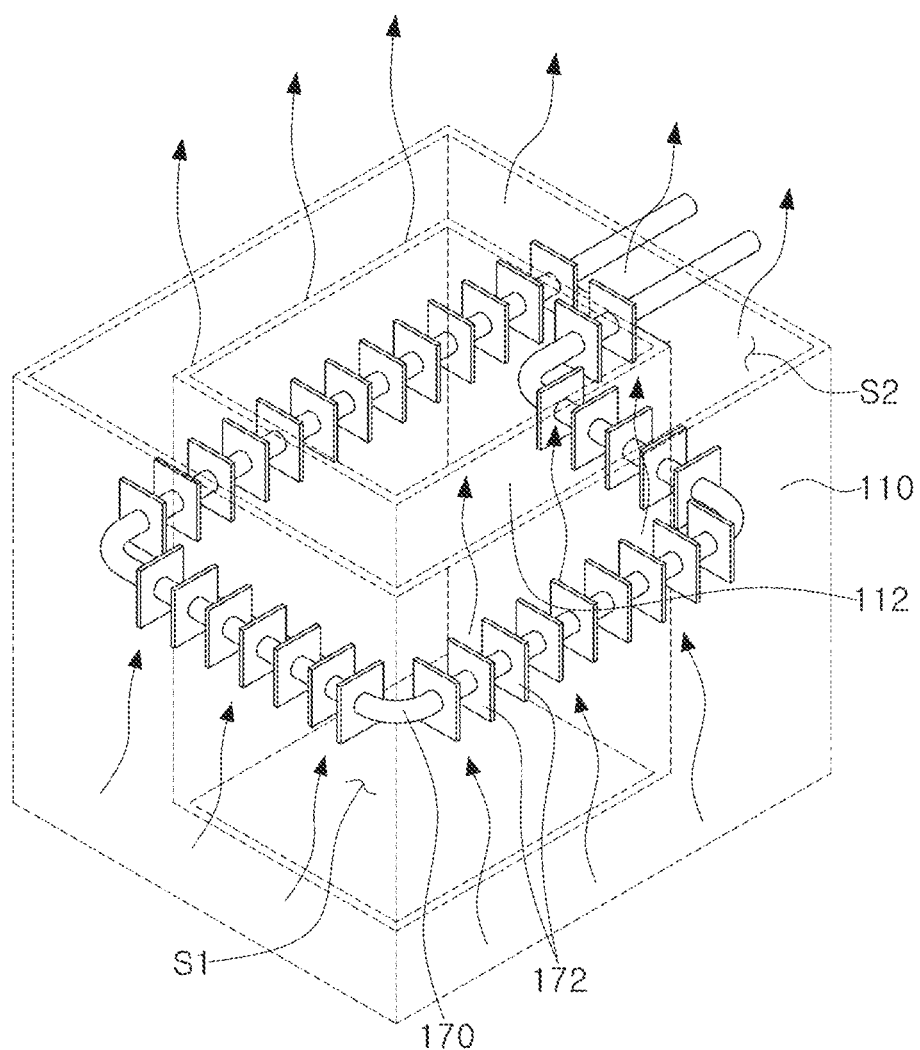
FIG. 2 is a diagrammatic view of a heat exchanger equipped in an apparatus for storing a mask according to an example embodiment.

FIG. 1 is a diagrammatic view of an apparatus for storing a mask according to exemplary embodiments of the present disclosure, and FIG. 2 is a diagrammatic view of a heat exchanger provided in an apparatus for storing a mask according to an example embodiment.

Referring to FIGS. 1 and 2, as an example, an apparatus for storing a mask 100 includes a main body 110, at least a mask container 120, a fan 130, a filter 140, a gas supply pipe 150, a Peltier element 160, a heat exchanger 170, and a controller 180.

The main body 110 may have an internal space divided into regions. As an example, the main body 110 may have a first region S1 in which a plurality of the mask containers 120 are disposed and a second region S2 disposed around the first region S1. To this end, the main body 110 may include a wall 112 to divide the first region S1 and the second region S2. A gas flow path may be provided in a lower portion and/or upper portion of the wall 112 for the gas flow.

The main body 110 is illustrated as having a cuboid shape, but is not limited thereto and can have other, various shapes, for example a cylinder.

A plurality of the mask containers 120 may be disposed in the first region S1 of the main body 110. A plurality of masks (not illustrated) may be received and/or stored in the plurality of mask containers 120. The types of the masks received and/or stored in the mask containers 120 may vary, for example the masks may be masks for UV and/or extreme ultraviolet (EUV) lithography. Meanwhile, gas supply pipes 150 are connected to the mask containers 120 and may supply a gas into the main body 110. Accordingly, the gas (for example, an inactive gas like $N_2$) may be directly provided inside the mask containers 120.

The fan 130 may be in the first region S1 of the main body 110. As an example, the fan 130 may be in an upper portion of the first region S1 above the mask container 120. Meanwhile, the fan 130 may allow the gas to flow inside the main body 110. As an example, the fan 130 may allow the gas to flow from the first region S1 to the second region S2. Thus, the gas provided in the mask container 120 may be discharged from the mask container 120 and flow to the lower portion of the first region S1. The gas flowing into the lower portion of the first region S1 through the fan operation may be introduced to a lower portion of the second region S2. The gas in the lower portion of the second region may flow up to an upper portion of the second region S2, for example, by differential pressures caused by the operation of the fan 130 and/or the gas supply pipe 150. Once the gas flows into an upper portion of the second region S2, the gas may be reintroduced to the first region S1. Likewise, the flow of the gas introduced into the main body 110 may be controlled by the operation of the fan 130.

The filter 140 may be at the front and/or the rear end of the fan 130 in the path of the gas flow. As an example, the filter 140 may include a first filter 142 above the fan 130 and/or a second filter 144 below the fan 130. The first filter 142 may reduce or eliminate chemical substances from the gas flow path, and the second filter 144 may reduce or eliminate foreign substance particle or particulates. However, the orientation and activity of the filter 140 is not limited thereto, and the number and type of the filters comprising the filter 140 may vary.

The filter 140 may be in an upper portion of the first region S1 together with the fan 130. In this regard, chemical substances and foreign substance particles contained in the gas flowing into the first region S1 from the second region S2 may be reduced or eliminated. Accordingly, filtered gas may be re-supplied to the mask container 120 from the second region S2.

The gas supply pipe 150 may be installed in the main body 110 to provide the gas to the main body 110 from the outside thereof. As an example, the gas supply pipe 150 may be connected to the mask container 120. Meanwhile, a portion of the gas supply pipe 150 may pass through a supplementary chamber 102 and extend toward the inside of the main body 110. The supplementary chamber 102 may be adjacent to the main body 110. The gas passing through the gas supply pipe 150 and supplied to the main body 110 may be, as an example, an inactive gas (e.g., $N_2$, Ag, or the like) or a mixture of inactive gases. Meanwhile, the humidity of the gas supplied through the gas supply pipe 150 may be at or near 0%. As gas having 0% humidity is supplied to the inside of the main body 110, the humidity of the first and second regions S1 and S2 of the main body 110 can be maintained at a low humidity.

The Peltier element 160 may be installed in an outer portion of the gas supply pipe 150 and may be located outside the main body 110. As an example, the Peltier element 160 may be inside the outer portion of gas supply pipe 150 inside the supplementary chamber 102. Meanwhile, the Peltier element 160 may heat or cool the gas supply pipe 150 to adjust the temperature of the gas flowing through the gas supply pipe 150. The Peltier element 160 may contain thermoelectric components employing the Peltier effect to create a heat flux between two materials, may be a solid-state thermoelectric device, and/or may act as a thermoelectric cooler, heater, and/or heat pump.

Meanwhile, a first sensor 190 upstream of the Peltier element 160 in the gas flow path may be installed in the gas supply pipe 150. The first sensor 190 may sense the temperature of the flowing gas. Information about the temperature sensed by the first sensor 190 may be delivered to the controller 180, and the controller 180 may control the operation of the Peltier element 160 in accordance with the temperature information sensed by the first sensor 190.

Accordingly, the temperature of the gas supplied to the main body 110 may be regulated according to the internal temperature of the main body 110.

The heat exchanger 170 may exchange heat with the gas circulating inside the main body 110, and may be in a lower portion of the second region S2 of the main body 110. As an example, the heat exchanger 170 may be formed of a flow tube in which a heat-exchange fluid, like water, may flow. That is, the gas circulating inside the main body 110 passes over the heat exchanger 170, thereby transferring heat to the heat exchanger 170. The heat exchanged to the heat exchanger may be transferred from the main body 110 to outside the apparatus through the transfer of the heat exchange fluid. In this regard, the temperature of the gas in the main body 110, having passed over the heat exchanger 170, may decrease. The heat exchanger 170 may also be, for example, a plate heat exchanger and have heat dissipation fins 172. The heat dissipation fins 172 may have, for example, a quadrangular shape. Meanwhile, the second sensor 192 at an upstream of the heat exchanger 170 in the gas flow path may be in the lower portion of the second region S2. The second sensor 192 senses the temperature and/or humidity of the gas circulating inside the main body 110. Information about the temperature and/or humidity sensed by the second sensor 192 may be delivered to the controller 180, and the controller 180 can adjust the temperature of the heat exchange fluid supplied to the heat exchanger 170.

Accordingly, the temperature and/or humidity of the gas circulating in the internal space of the main body 110 can be regulated and maintained at consistent or near consistent conditions.

The controller 180 may be connected to the first sensor 190, the second sensor 192 and the Peltier element 160 to allow the communication of signals and information between the controller 180 and the first sensor 190, the second sensor 192 and the Peltier element 160. The controller 180 may be connected to a heat exchange fluid-supply unit (not illustrated) and, for example, may control the supply of cooling water in the heat exchanger 170. The heat exchange fluid-supply unit may be, for example, a pump passing the heat exchange fluid (e.g., water) over a cooling coil or may be part of a refrigeration system, and may facilitate the transfer of heat away from the interior of the main body 110.

Meanwhile, the controller 180 may control the Peltier element 160 according to a signal of the first sensor 190 to adjust the temperature of the gas flowing through the gas supply pipe 150. Further, the controller 180 may control the temperature of the heat exchange fluid flowing into the heat exchanger 170 according to a signal received from the second sensor 192. The controller 180 may thus maintain the temperature of the gas circulating in the internal space of the main body 110 at a consistent range. The controller 180 may be connected to the gas supply unit (not illustrated) and adjust the supply of gas into the main body 110 according to a signal from the second sensor 192.

The controller 180 may be processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), and programmable logic unit, a microprocessor, application-specific integrated circuit (ASIC), etc.

The processing circuitry may be connected to memory. The memory may include a permanent mass storage device, such as random access memory (RAM), read only memory (ROM), a disk drive, a solid-state drive (SSD), a flash memory, etc., as a non-transitory computer-readable storage medium. Software comprising instructions to be executed by the processing circuitry may be stored in the memory. The instructions stored in the memory may comprise instructions for regulating the internal temperature of the main body 110 depending on the relationship between the temperatures detected by the first sensor 190 and/or the second sensor 192 and the inputs and outputs stored in a look-up table. The outputs may be related to instructions for adjusting the temperature of the Peltier element 160, the flow of the gas in the gas supply pipe 150, and/or the temperature and/or flow of the heat exchange fluid in the heat exchanger 170 based on the stored outputs. The look-up table may be a design parameter prepared through empirical study.

For example, the controller 180 may receive information of the temperature from second sensor 192, use this information as an input or index to the look-up table, access a corresponding output in the look-up table, and regulate the flow and/or temperature of the gas in the gas supply pipe 150 based on the accessed output. The output may be a command to increase and/or decrease the flow of the gas through the gas supply pipe 150, to increase and/or decrease the temperature of the Peltier element 160, or a combination of instructions. The controller 180 may access a second look-up table stored in the memory for regulation of the Peltier element 160 using the output of the first look-up table as a first input and the information received from the first sensor 190 as a second input. The output of the second look-up table may be an output for the current to be supplied to the Peltier element 160. The controller 180 may access another look-up table stored in the memory for controlling the flow and/or temperature of heat exchange fluid in the heat exchanger 170 depending on input received from the second sensor 192. The controller 180 may also access a look-up table using outputs received from the first sensor 190, the second sensor 192, or the combination thereof, to obtain outputs directed towards the operation of the gas supply unit, the gas supply pipe 150, the Peltier element 160, and/or the heat exchanger 170.

The controller 180 may control the Peltier element 160, the heat exchanger 170, the gas supply unit, and the heat exchange fluid-supply unit (e.g., a cooling water-supply unit) to maintain the main body 110 at an internal temperature of 22° C.±0.5° C. and humidity of 5% or less. Accordingly, a mask, like a mask for EUV, may be stored in the mask container 120 and may be maintained in a low moisture, low temperature environment, which may extend the useful lifetime of the mask.

As previously described, the cleanness, temperature, and humidity of the gas circulating inside the main body 110 can be managed. That is, the temperature of the main body 110 can be maintained by gas whose temperature is maintained to be consistent by adjusting the temperature of the gas flowing into the main body 110. Further, the internal humidity of the main body 110 can be adjusted by adjusting the amount of the gas having low or no humidity supplied to the main body 110. Accordingly, the humidity of the gas circulating inside the main body 110 can be adjusted. In addition, as the gas circulating inside the main body 110 passes through the filter 140, its cleanness can be maintained. The gas circulating inside the main body 110 may exchange heat with the heat exchanger, thereby further maintaining a consistent temperature.

By allowing the gas to circulate inside the main body 110, it is unnecessary to supply a large amount of external gas to the inside of the main body 110. In other words, an amount of gas being supplied to the main body 110 can be reduced compared to systems that vent the gas and/or do not recycle the gas.

Herein below, an operation of the mask container according to an example embodiment will be described with respect to the accompanying drawings.

Figure 3:
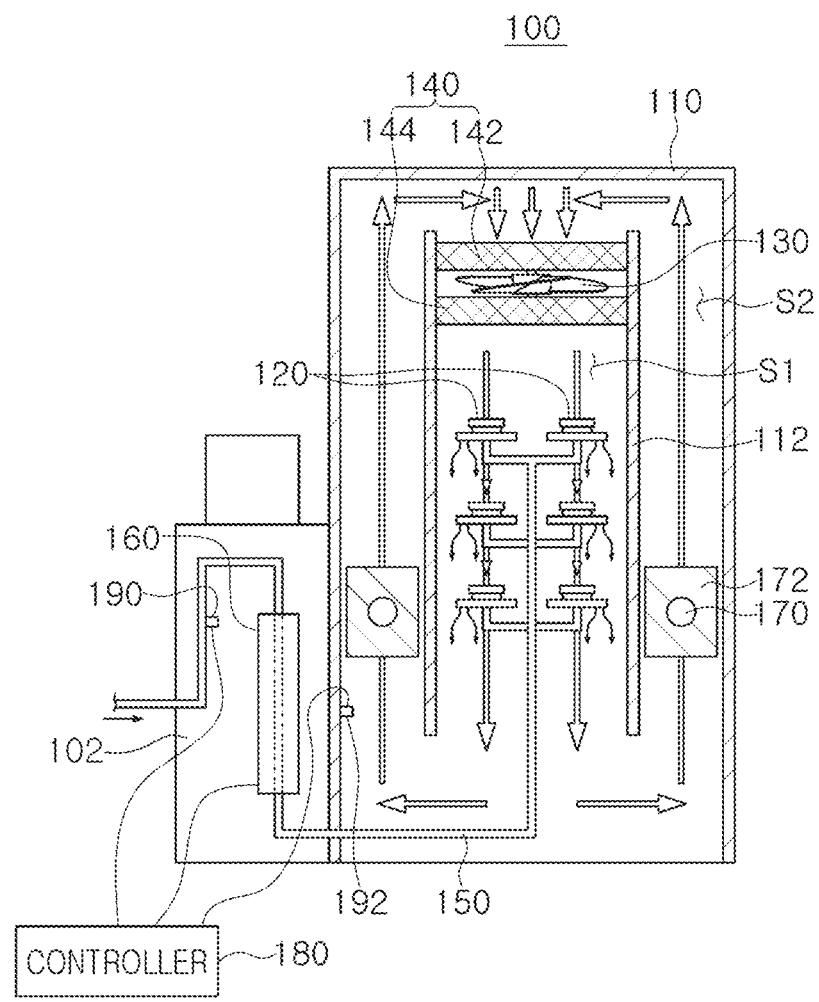
FIG. 3 is an explanatory diagram illustrating an operation of an apparatus for storing a mask according to an example embodiment.

FIG. 3 is a diagram illustrating an operation of an apparatus for storing a mask according to another example embodiment. Like reference numerals designate like elements and a description thereof will not be repeated.

The controller 180 may operate the Peltier element 160 according to information received from the first sensor 190 about the temperature of the gas in the gas supply pipe 150. Accordingly, the gas flowing through the gas supply pipe 150 may be adjusted. The gas circulating through the gas supply pipe 150 may be supplied to the mask container 120 in the first region S1 of the main body 11, and the gas released from the mask container 120 flows toward the lower portion of the first region S1.

The fan 130 may be running in an upper portion of the first region S1 of the main body 110, moving the gas toward the lower portion of the first region S1 and into the second region S2. The second sensor 192 may be in the lower portion of the second region S2 and may sense the temperature and humidity of the gas in the second region s2. Information about the gas's temperature and/or humidity may be delivered to the controller 180. The controller 180 may control the temperature of cooling water inflowing to the heat exchanger 170 according to a signal from the second sensor 192. The controller 180 may also adjust the amount of the gas flowing into the main body 110 according to the signal of the second sensor 192, thereby maintaining the temperature and/or the humidity of the gas circulating in the internal space of the main body 110.

As described above, the controller 180 may control the operation of the gas supply unit, the gas supply pipe 150, the Peltier element 160, and the heat exchanger 170 by using the information received from the first and second sensor 190 and 192 as an input or index to a look-up table stored in the memory and accessing a corresponding output in the look-up table to control the flow rate and/or temperature of the heat exchange fluid supplied to the heat exchanger 170, the flow of gas through the gas supply pipe 150, and/or the temperature of the Peltier element 160.

The gas flowing from the second region S2 may pass through the filter 140 and flow into the first region S1. Accordingly, chemical substances and foreign particles contained in the gas can be filtered and, thus, reduced, minimized, or eliminated.

Part of the gas introduced in the first region S1 may flow into the mask container 120.

As previously described, the cleanness, the temperature, and the humidity of the gas circulating inside the main body 110 can be managed. That is, by adjusting the temperature of the gas flowing into the main body 110 through the Peltier element 160, gas having a consistent temperature can be supplied to the inside of the main body 110. Further, by adjusting a supply amount of a gas having 0% humidity, the internal humidity of the main body 110 can be adjusted. Accordingly, the humidity of the gas circulating inside the main body 110 can be adjusted. In addition, the gas circulating inside the main body 110 may pass through the filter 140, thereby maintaining the cleanness of the gas. The gas circulating inside the main body 110 may exchange heat with a heat exchanger, thereby maintaining the temperature thereof consistent.

Further, by allowing the gas to circulate inside the main body 110 it is not necessary to supply a large amount of external gas to the inside of the main body 110. That is, the amount of the gas being supplied to the main body 110 can be reduced.

Figure 4:
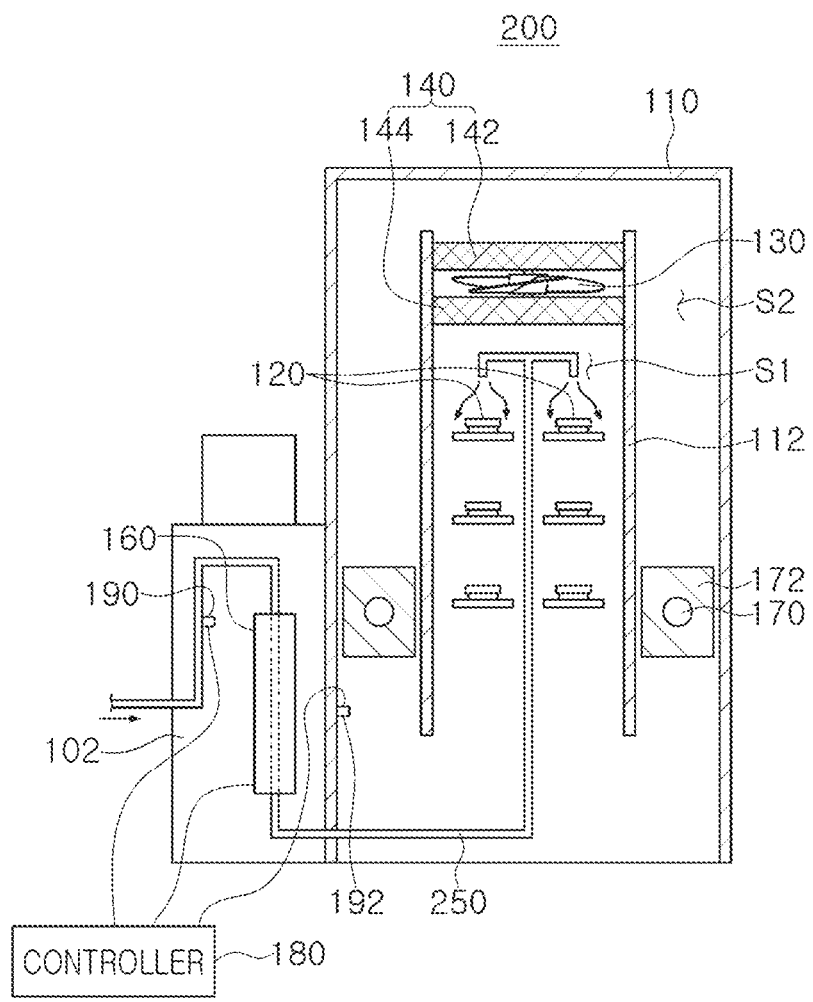
FIG. 4 is a structural view of an apparatus for storing a mask according to an example embodiment.

FIG. 4 is a structural view of an apparatus for storing a mask according to exemplary embodiments.

Based on FIG. 4, the apparatus for storing a mask 200 includes, a main body 110, a mask container 120, a fan 130, a filter 140, a gas supply pipe 250, a Peltier element 160, a heat exchanger 170 and a controller 180.

The main body 110, the mask container 120, the fan 130, the filter 140, the gas supply pipe 250, the Peltier element 160, the heat exchanger 170, and the controller 180 are the same constitutional element as those previously described, and thus, detailed descriptions thereof are omitted.

As described above, the controller 180 may control the operation of the gas supply unit, the gas supply pipe 150, the Peltier element 160, and the heat exchanger 170 by using the information received from the first and second sensor 190 and 192 as an input or index to a look-up table stored in the memory and accessing a corresponding output from the look-up table to control the flow and/or temperature of the heat exchange fluid supplied to the heat exchanger 170, the flow of gas through the gas supply pipe 150, and/or the temperature of the Peltier element 160.

The gas supply pipe 250 may be installed in the main body 110 to supply gas to the main body 110 from outside the main body 110. As an example, an end of the gas supply pipe 250 may be in a first region S1 of the main body 110. Gas supplied from the gas supply pipe 250 may be supplied to an upper portion of the first region S. Part of the supplied gas may then flow into the mask container 120. Meanwhile, the gas supply pipe 250 may pass through a supplementary chamber 102 adjacent to the main body 110 to extend toward the inside of the main body 110. The gas being supplied to the main body 110 through the gas supply pipe 250 may be, for example, an inactive gas (e.g., $N_2$, Ag, or the like) or a combination of inactive gases.

While embodiments have been shown and described above, it will be apparent to those skilled in the art that the embodiments of the apparatus are not limited to the above description and that the modifications and variations could be made without departing from the scope of the example embodiments as defined by the appended claims.

What is claimed is:

1. An apparatus for storing a mask, comprising:
   a main body defining a first region and a second region around the first region;
   a plurality of mask containers in the first region, the plurality of mask containers configured to store masks;
   a gas supply pipe having an outer portion, the outer portion of the gas supply pipe being outside of the main body, the gas supply pipe configured to supply gas to the main body;
   a fan in the first region, the fan configured to propel the gas from the second region to the first region;
   a filter disposed at at least one of a front end and a rear end of the fan, the filter in a gas flow path of the gas;
   a heat exchanger in the second region, the heat exchanger configured to exchange heat with the gas;
   a Peltier element at the outer portion of the gas supply pipe;
   a first sensor in the gas supply pipe, the first sensor upstream of the Peltier element in the gas flow path;
   a second sensor in the second region of the main body, the second sensor lower in the second region than the heat exchanger; and
   a controller connected to the first sensor, the second sensor, and the Peltier element.

2. The apparatus of claim 1, wherein
   the controller is configured to control the Peltier element to adjust a temperature of the gas supplied to the main body according to a signal from the first sensor, and
   the controller is configured to adjust a temperature of cooling water flowing into the heat exchanger and an amount of the gas flowing through the gas supply pipe according to a signal from the second sensor.

3. The apparatus of claim 1, wherein the filter comprises a first filter configured to eliminate a chemical substance and a second filter configured to eliminate particles.

4. The apparatus of claim 1, wherein the heat exchanger comprises a cooling water-flow tube configured to carry cooling water.

5. The apparatus of claim 4, wherein the heat exchanger is in a lower portion of the second region.

6. The apparatus of claim 1, wherein the gas supply pipe is connected to a mask container of the plurality of mask containers to directly supply the gas to an inside of the mask container.

7. The apparatus of claim 1, wherein the gas supply pipe is configured to supply the gas into the first region.

8. The apparatus of claim 1, wherein the main body is configured such that the gas flows to a lower portion of the first region, from the lower portion of the first region to a lower portion of the second region, from the lower portion of the second region to an upper portion of the second region, and then re-introduced into the first region.

9. The apparatus of claim 1, further comprising:
   a supplementary chamber adjacent to the main body, wherein the Peltier element is inside the supplementary chamber.

10. The apparatus of claim 1, wherein the plurality of mask containers are configured to store a mask for extreme ultraviolet (EUV).

11. The apparatus of claim 2, wherein the controller is configured to maintain an internal space of the main body at 22° C.±0.5° C.

12. The apparatus of claim 2, wherein the controller is configured to maintain a humidity of an interior of the main body at 5% or lower.

13. An apparatus for saving a mask, comprising:
   a main body having an interior space, the interior space being divided by a wall into at least a first region and a second region;
   a mask container in the interior space of the main body;
   a gas supply pipe configured to provide gas to the interior space of the main body, the gas supply pipe having an outer portion, the outer portion of the gas supply pipe being outside the main body;
   a fan configured to flow the gas introduced into the interior space of the main body;
   a filter installed at at least one end of a front end and a rear end of the fan in a gas flow path;
   a heat exchanger configured to exchange heat with the gas flowing in the interior space; and
   a Peltier element in the outer portion of the gas supply pipe.

14. The apparatus of claim 13, further comprising:
   a first sensor installed in the gas supply pipe upstream of the Peltier element in the gas flow path.

15. The apparatus of claim 14, further comprising:
   a second sensor installed in the second region of the main body in a lower portion of the heat exchanger.

16. The apparatus of claim 15, further comprising:
   a controller connected to the first sensor, the second sensor, and the Peltier element.

17. The apparatus of claim 13, further comprising:
   a supplementary chamber adjacent to the main body, wherein the Peltier element is inside the supplementary chamber.

18. The apparatus of claim 13, further comprising:
   a first filter configured to eliminate a chemical substance; and
   a second filter configured to eliminate a foreign substance particle.

19. The apparatus of claim 13, wherein the mask container is configured to store a mask for extreme ultraviolet (EUV).

20. The apparatus of claim 13, further comprising:
a controller configured to maintain an internal space of the main body at 22° C.±0.5° C.

\* \* \* \* \*